(12) United States Patent
Shiozawa et al.

(10) Patent No.: US 6,859,579 B2
(45) Date of Patent: Feb. 22, 2005

(54) OPTICAL SWITCHER USED FOR BROADCAST STATION

(75) Inventors: Takahiro Shiozawa, Tokyo (JP); Kenichirou Suzuki, Tokyo (JP); Takashi Mizutani, Tokyo (JP)

(73) Assignee: NEC Corporation, Tokyo (JP)

( * ) Notice: Subject to any disclaimer, the term of this patent is extended or adjusted under 35 U.S.C. 154(b) by 203 days.

(21) Appl. No.: 10/256,004

(22) Filed: Sep. 27, 2002

(65) Prior Publication Data

US 2003/0063841 A1 Apr. 3, 2003

(30) Foreign Application Priority Data

Sep. 28, 2001 (JP) ........................................ 2001-301697

(51) Int. Cl.[7] .............................................. G02B 6/41
(52) U.S. Cl. ......................................... 385/18; 385/17
(58) Field of Search .................................... 385/17, 18

(56) References Cited

U.S. PATENT DOCUMENTS

| | | | | |
|---|---|---|---|---|
| 6,366,715 B1 * | 4/2002 | Wang | ............................ | 385/17 |
| 6,396,976 B1 * | 5/2002 | Little et al. | .................... | 385/18 |
| 6,427,083 B1 * | 7/2002 | Owen et al. | .................... | 607/5 |
| 6,430,333 B1 * | 8/2002 | Little et al. | .................... | 385/18 |
| 6,449,407 B1 * | 9/2002 | Kiang et al. | .................... | 385/18 |
| 6,453,083 B1 * | 9/2002 | Husain et al. | ................ | 385/17 |
| 6,477,290 B1 * | 11/2002 | Wan et al. | ...................... | 385/17 |
| 6,493,479 B1 * | 12/2002 | Briggs | ........................... | 385/17 |
| 6,501,869 B1 * | 12/2002 | Athale | ........................... | 385/18 |
| 6,519,383 B1 * | 2/2003 | Cannell | ......................... | 385/18 |
| 6,606,428 B2 * | 8/2003 | Goldstein et al. | ............. | 385/18 |
| 6,668,108 B1 * | 12/2003 | Helkey et al. | ................. | 385/18 |
| 2002/0126948 A1 * | 9/2002 | Lim et al. | ...................... | 385/17 |
| 2002/0164109 A1 * | 11/2002 | Oikawa et al. | ................ | 385/17 |
| 2002/0181876 A1 * | 12/2002 | Chang | ........................... | 385/47 |
| 2003/0048979 A1 * | 3/2003 | Beerling et al. | .............. | 385/18 |
| 2003/0068117 A1 * | 4/2003 | Syms | ............................. | 385/18 |

* cited by examiner

*Primary Examiner*—Jared J. Fureman
*Assistant Examiner*—Allyson N Trail
(74) *Attorney, Agent, or Firm*—Young & Thompson

(57) ABSTRACT

To provide an optical switcher capable of sending incident light on one input port to any plurality of output ports. The optical switcher includes input ports disposed on extensions of m input optical paths (m being 2 or greater natural number), output ports disposed on extensions of n output optical paths (n being 2 or greater natural number), and movable translucent switch mirrors $3_{11}$–$3_{mn}$, disposed at intersections of the m input optical paths and the n output optical paths, for switching between the input optical paths and the output optical paths. A switch mirror $3_{11}$–$3_{mn}$ located nearer the input ports has a higher transmittance.

12 Claims, 7 Drawing Sheets

US 6,859,579 B2

OPTICAL SWITCHER USED FOR BROADCAST STATION

BACKGROUND OF THE INVENTION

1. Field of the Invention

The present invention relates to an optical switcher used in a signal transmission/distribution system or the like used in a broadcast station.

2. Description of the Related Art

In the past, optical switchers having a plurality of inputs and outputs have been developed for cross connection in a trunk transmission network. In general, cross connection in the trunk transmission network is only required to implement a N-to-N nonblocking switching, and is not required to implement a one-to-N broadcasting mode connection. To the contrary, switchers used in a broadcast station or the like are required to have a capability of signal distribution, and thus, the one-to-N broadcasting mode connection is required. Conventionally, only switching of an uncompressed SDTV (Standard Definition Television) serial digital signal transferred at a rate of 270 Mb/s at most was needed, and thus, the one-to-N broadcasting mode connection could be readily realized electrically by electrical switchers.

Recently, broadcast stations have been required to transmit and switch an uncompressed HDTV (High Definition Television) serial digital signal at a transfer rate of 1.5 Gb/s. In order to transmit the serial digital signal at a rate of 1.5 Gb/s for 100 meters or more, optical fiber transmission is essentially used. At present, as shown in FIG. 1, optical fiber transmission and an electrical switcher are used. In FIG. 1, reference numeral 101 denotes an electric-optic (E/O) converter for converting an input serial digital signal into an optical signal, reference numeral 102 denotes an optical fiber for transmitting the optical signal sent from the E/O converter 101, reference numeral 103 denotes an opto-electric (O/E) converter for converting the optical signal received from the optical fiber 102 into an electric signal (serial digital signal), reference numeral 104 denotes an electrical switcher for switching the serial digital signal, reference numeral 105 denotes an E/O converter for converting the serial digital signal output from the electrical switcher 104 into an optical signal, reference numeral 106 denotes an optical fiber for transmitting the optical signal sent from the E/O converter 105, and reference numeral 107 denotes an O/E converter for converting the optical signal received from the optical fiber 106 into an electric signal (serial digital signal).

In such a conventional signal transmission/distribution system, the O/E converters 103, the O/E converter 105 and the electrical switcher 104 are necessarily located on the optical fiber transmission path. Therefore, the system becomes disadvantageously complicated. If an optical switcher enabling one-to-N broadcasting mode connection is provided, transmission and switching can be accomplished optically, and thus, the system can be simplified and the cost can be reduced.

SUMMARY OF THE INVENTION

The present invention has been devised to solve such a problem. Accordingly, an object of the present invention is to provide an optical switcher capable of sending incident light on one input port to any plurality of output ports.

An optical switcher according to the present invention comprises: input ports ($2_1$–$2_m$) disposed on extensions of m input optical paths (m being 2 or greater natural number); output ports ($4_1$–$4_n$) disposed on extensions of n output optical paths (n being 2 or greater natural number); and movable switch mirrors ($3_{11}$–$3_{mn}$), disposed at intersections of the m input optical paths and the n output optical paths, for switching between the input optical paths and the output optical paths, in which the movable mirrors are translucent mirrors.

BRIEF DESCRIPTION OF THE DRAWINGS

This above-mentioned and other objects, features and advantages of this invention will become more apparent by reference to the following detailed description of the invention taken in conjunction with the accompanying drawings, wherein.

DETAILED DESCRIPTION OF THE EMBODIMENTS

[First Embodiment]

Figure 2:
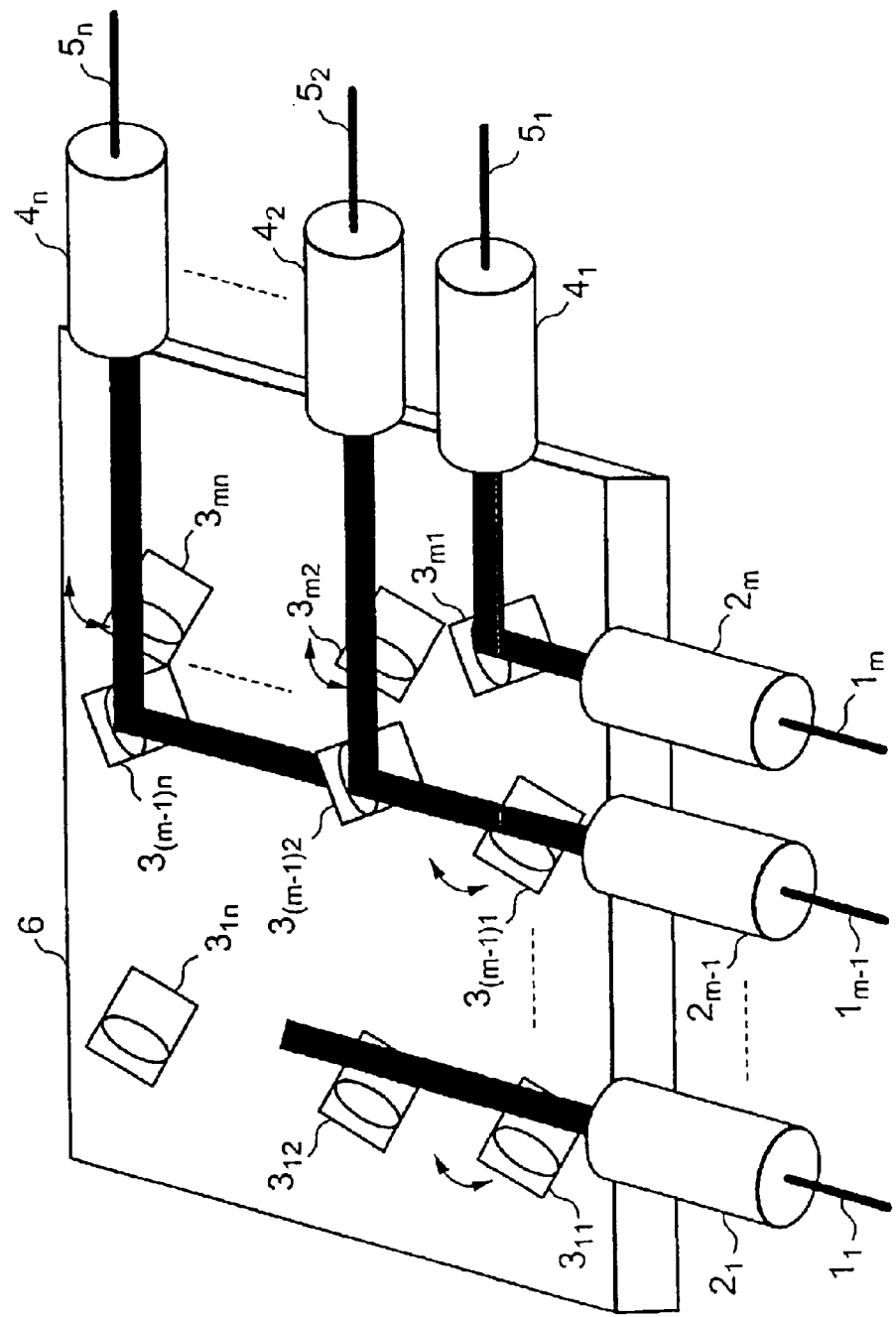
FIG. 2 is a perspective view of an optical switcher of a first embodiment according to the invention.
Figure 3:
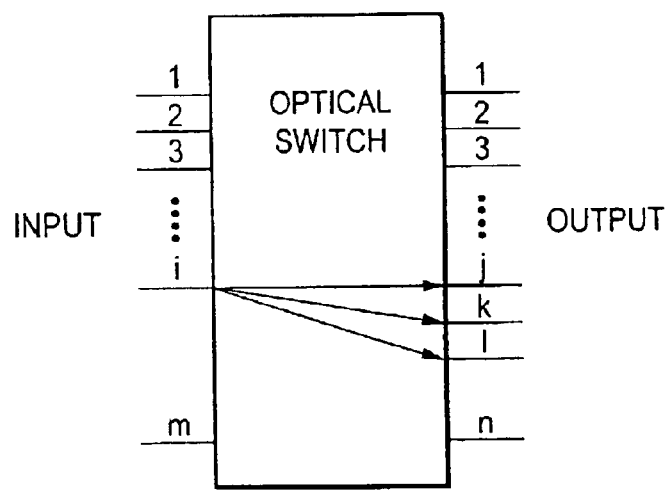
FIG. 3 illustrates broadcasting mode connection by the optical switcher shown in FIG. 2.

Referring to FIG. 2 showing a perspective view of an optical switcher of the first embodiment according to the invention and FIG. 3 illustrating broadcasting mode connection in the optical switcher of FIG. 2, the optical switcher has a plurality of outputs and enables the one-to-N broadcasting mode connection (N being a natural number). In the optical switcher in FIG. 2, for example, incident light on the i-th input is to be sent to any plurality of outputs, specifically, the j-th, k-th and l-th outputs.

As shown in FIG. 2, the optical switcher according to the invention comprises m input optical fibers $1_1$–$1_m$ (m being 2 or greater natural number), input collimator lenses $2_1$–$2_m$ disposed at m input ports associated with the input optical fibers $1_1$–$1_m$, respectively, m-by-n translucent switch mirrors $3_{11}$–$3_{mn}$ (n being 2 or greater natural number), m-by-n drive mechanisms each composed of a power source, such as a piezoelectric actuator that is displaced depending on an external control signal, and transmission means for transmitting the displacement of the power source to the associated one of the translucent mirrors $3_{11}$–$3_{mn}$ to cause the same to rotate, output collimator lenses $4_1$–$4_n$ disposed at n output ports, n output optical fibers $5_1$–$5_n$, input collimator lenses $2_1$–$2_m$, translucent switch mirrors $3_{11}$–$3_{mn}$, and a base 6 on which the drive mechanisms and the output collimator lenses $4_1$–$4_m$, are mounted.

Each of the translucent switch mirrors $3_{11}$–$3_{mn}$ is provided with its own drive mechanism. The drive mechanism enables each of the switch mirrors $3_{11}$ to $3_{mn}$ to assume, independently of others, an upright position in which it reflects part of propagation light incident from the associated input collimator lens (input optical path) toward the associated output collimator lens or a laid position in which it does not intercept the propagation light from the associated input collimator lens to allow it to travel straight ahead. The positions of the translucent switch mirrors $3_{11}$–$3_{mn}$ can be controlled by applying control signals to their respective drive mechanisms from an external control circuit.

Of course, the switch mirrors $3_{11}$, $3_{12}$, $3_{13}$, ..., $3_{1n}$ are associated with the input collimator lens $1_1$, the switch mirrors $3_{(m-1)1}$, $3_{(m-1)2}$, $3_{(m-1)3}$, ..., $3_{(m-1)n}$ are associated with the input collimator lens $1_{m-1}$, the switch mirrors $3_{m1}$, $3_{m2}$, $3_{m3}$, ..., $3_{mn}$ are associated with the input collimator lens $1_m$, the switch mirrors $3_{11}$, $3_{21}$, $3_{31}$, ..., $3_{m1}$ are associated with the output collimator lens $4_1$, the switch mirrors $3_{12}$, $3_{22}$, $3_{32}$, ..., $3_{m2}$ are associated with the output collimator lens $4_2$, and the switch mirrors $3_{1n}$, $3_{2n}$, $3_{3n}$, ..., $3_{mn}$ are associated with the output collimator lens $4_n$.

Figure 1:
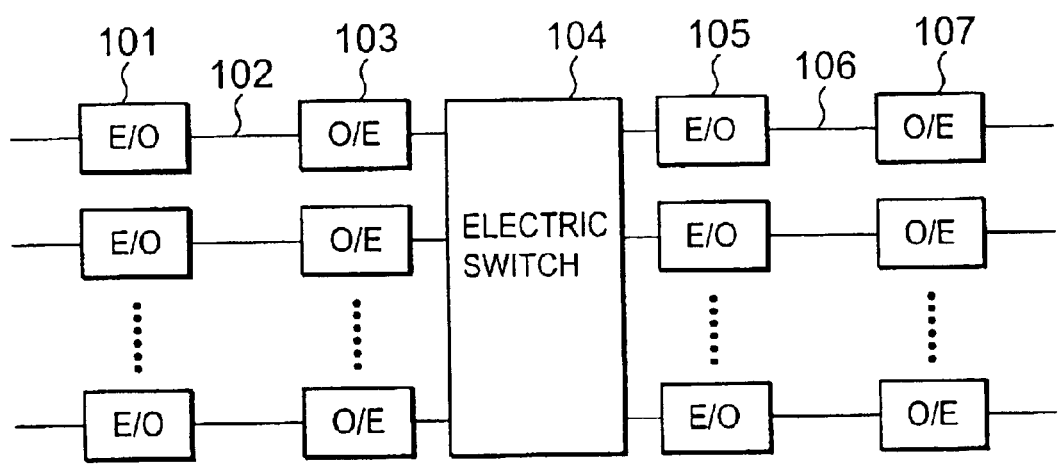
FIG. 1 shows a configuration of a conventional signal transmission/distribution system used in a broadcast station.

Now, referring to FIG. 1, an operation of the optical switcher according to this embodiment will be described in detail. For example, an optical signal input via the input optical fiber $1_m$ is converted into parallel light by the input collimator lens $2_m$ to propagate in a space. If the switch mirror $3_{m1}$ is in the upright position, the propagation light is reflected by the switch mirror $3_{m1}$ toward the output collimator lens $4_1$, absorbed into the output collimator lens $4_1$, and then sent (coupled) to the output optical fiber $5_1$.

If the switch mirror $3_{m1}$ is in the laid position, the propagation light travels straight ahead without being reflected toward the output collimator lens $4_1$. In this way, the optical signal input via the input optical fiber $1_m$ can be switched to the output optical fiber $5_1$ by controlling the rotation angle of the switch mirror $3_{m1}$.

Similarly, the optical signal input via the input optical fiber $1_m$ can be switched to the output optical fibers $5_2$–$5_n$ by controlling the rotation angles of the switch mirrors $3_{m2}$–$3_{mn}$, respectively. The operation described so far is the same as that of conventional optical switchers and the switch mirrors $3_{11}$–$3_{mn}$ have been assumed to be total reflection mirrors. However, according to this embodiment, the switch mirrors $3_{11}$–$3_{mn}$ are translucent mirrors (half mirrors). Consequently, according to this embodiment, the one-to-N broadcasting mode connection can be realized. Now, an example of the one-to-N broadcasting mode connection will be described with reference to FIG. 1.

For example, an optical signal input via the input optical fiber $1_{m-1}$ is converted into parallel light by the input collimator lens $2_{m-1}$ to propagate in a space. If the switch mirror $3_{(m-1)1}$ is in the upright position, part of the propagation light is reflected by the switch mirror $3_{(m-1)1}$ toward the output collimator lens $4_1$ and sent to the output optical fiber $5_1$ through the output collimator lens $4_1$.

The remaining part of the propagation light, which has passed through the switch mirror $3_{(m-1)1}$, travels straight ahead and, if the switch mirror $3_{(m-1)2}$ is in the upright position, is partially reflected by the switch mirror $3_{(m-1)2}$ toward the output collimator lens $4_2$ and sent to the output optical fiber $5_2$ through the output collimator lens $4_2$. The remaining part of the propagation light, which has passed through the switch mirror $3_{(m-1)2}$, travels straight ahead and, if the switch mirror $3_{(m-1)n}$ is in the upright position, is reflected by the switch mirror $3_{(m-1)n}$ toward the output collimator lens $4_n$ and sent to the output optical fiber $5_n$ through the output collimator lens $4_n$.

Similarly, the optical signal input via the input optical fiber $1_{m-1}$ can be switched to the output optical fibers $5_1$–$5_n$ by controlling the angles of the switch mirrors $3_{(m-1)1}$–$3_{(m-1)n}$ on the optical path, respectively, in any one-to-N broadcasting mode. Furthermore, according to this embodiment, a translucent switch mirror located nearer the input collimator lenses $2_1$–$2_m$ has a higher transmittance. In other words, a translucent switch mirror located nearer the input collimator lenses $2_1$–$2_m$ has a lower reflectance. This transmittance/reflectance arrangement generally can reduce variations in the powers of the optical outputs in the one-to-N broadcasting mode switching.

Figure 4A:
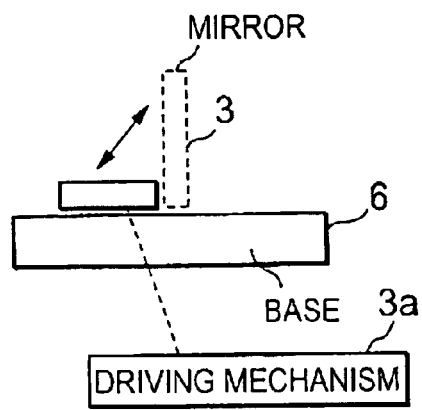
FIGS. 4(a) and 4(b) show movement of translucent switch mirrors applied to the optical switcher shown in FIG. 2.
Figure 4B:
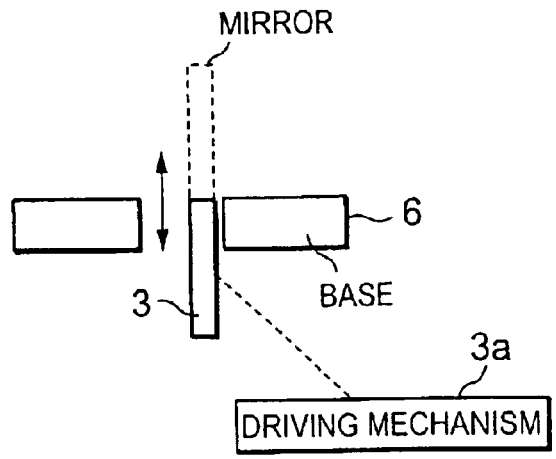

In the first embodiment, the translucent switch mirrors $3_{11}$–$3_{mn}$ have been described as rotary type switch mirrors capable of assuming two, upright and laid, positions, as shown in FIG. 4(a). Alternatively, as shown in FIG. 4(a), the translucent switch mirror may be a linear type switch mirror that is moved linearly between a position in which it reflects part of propagation light incident from the associated input collimator lens toward the associated output collimator lens and a position in which it allows the propagation light to travel straight ahead without interception. For driving the mirrors 3, driving mechanism 3a such as piezoceramics is applied to each of the mirror 3.

Figure 5:
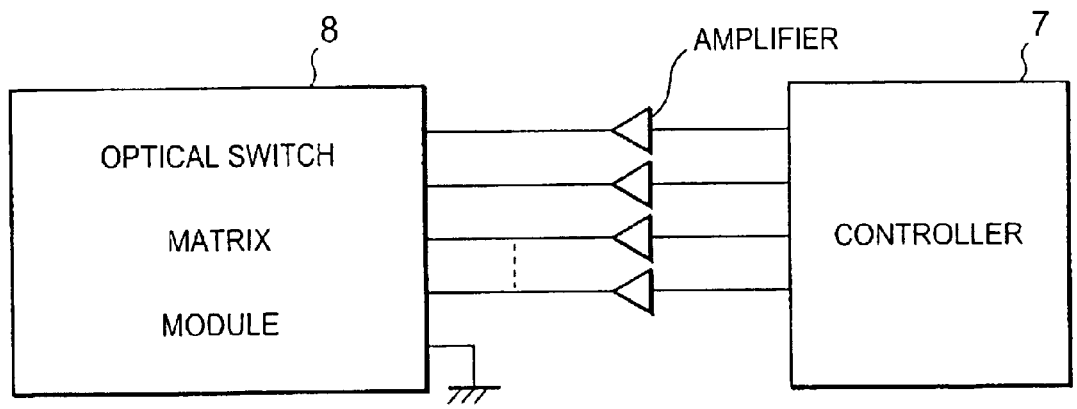
FIG. 5 shows a driving circuit arrangement applied to the optical switcher shown in FIG. 2.

FIG. 5 shows driving circuit arrangement. In FIG. 5, a controller 7 delivers driving signals for each of the driving mechanism 3a arranged at each of cross points in the optical switch matrix module 8. If piezoceramics is applied as the driving mechanism 3a, the controller 7 supplies certain voltages to the piezoceramics though amplifiers.

[Second Embodiment]

Figure 6:
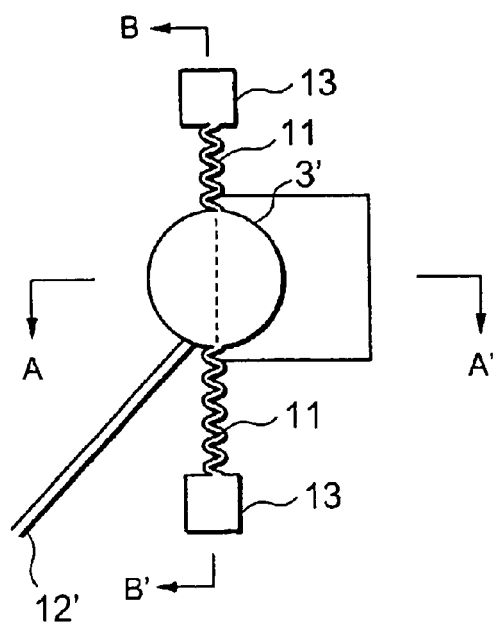
FIG. 6 is a plain view of an optical switcher of a second embodiment according to the present invention.
Figure 7:
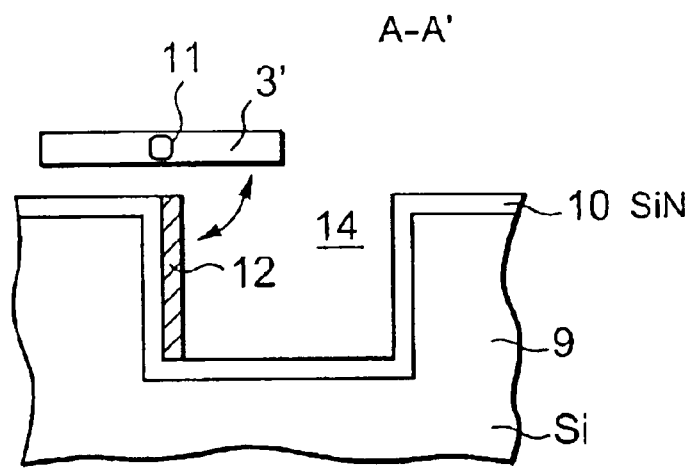
FIG. 7 shows a sectional view in an A–A' axis illustrated in FIG.6.
Figure 8:
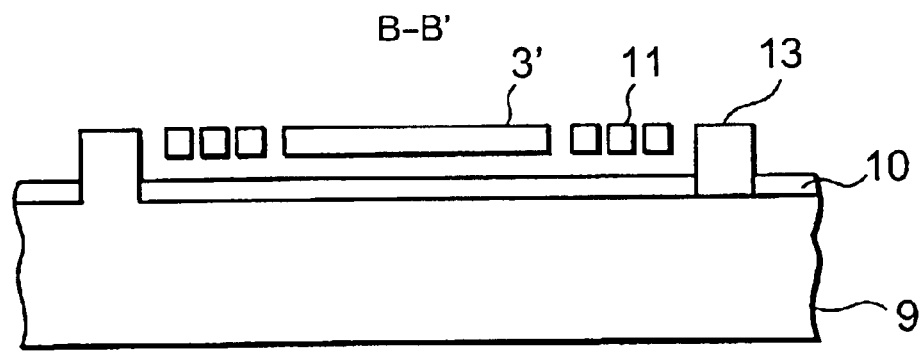
FIG. 8 shows a sectional view in a B–B' axis illustrated in FIG. 6.

Furthermore, the base 6 and the translucent switch mirrors $3_{11}$–$3_{mn}$ can be implemented as a microelectro-mechanical system (MEMS) by forming them in a silicon substrate by a semiconductor process. Hereinafter, a second embodiment according the present invention formed in a silicon substrate will be described with reference to the FIGS. 6, 7, and 8. In FIG. 6 showing a plain view of the second embodiment, a translucent mirror plate 3', springs 11 and projecting supports 13 are made of the same substrate of polySilicon. As shown in FIGS. 7 and 8 respectively showing sectional views in A–A' and B–B' axes of FIG. 6, the mirror plate 3' and springs 11 are supported by the supports 13 and positioned above a substrate 9 of Silicon (Si). In the substrate 9, trench 14 is formed and its surface is covered by SiN deposition. Further, metal material such as aluminum (Al) 12 is deposited on a part of the trench wall as shown in FIG. 7 and thus the mirror plate 3' can be rotated in the trench 14 by electrostatic attraction between the metal material 12 and the mirror plate 3' when a voltage is supplied to the metal material 12. To supply the voltage, a metal wiring pattern 12' is also arranged on the substrate 9. In the second embodiment, transmittance of the mirror plate 3' can be controlled by thickness of the mirror plate 3', for example.

Figure 9A:
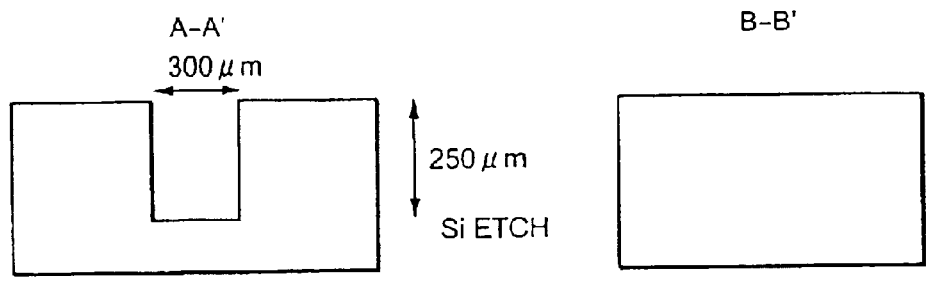
FIGS. 9(a)–9(d) show producing processes applied to a first substrate in the A–A' and B–B' axes to produce the optical switcher of the second embodiment.
Figure 9B:
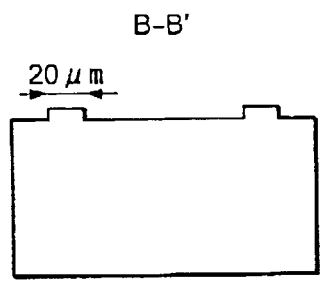
Figure 9C:
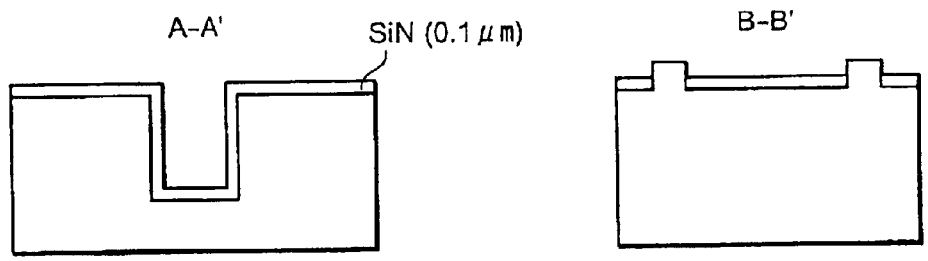
Figure 9D:
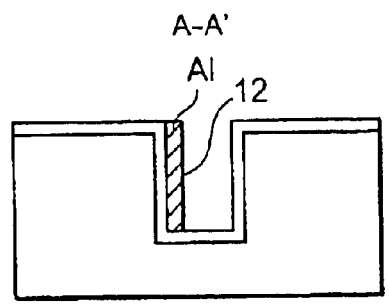
Figure 10A:
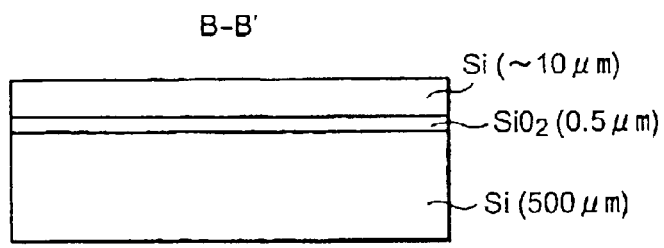
FIGS. 10(a) and 10(b) show producing processes applied to a second substrate in the B–B' axis to produce the optical switcher of the second embodiment.
Figure 10B:
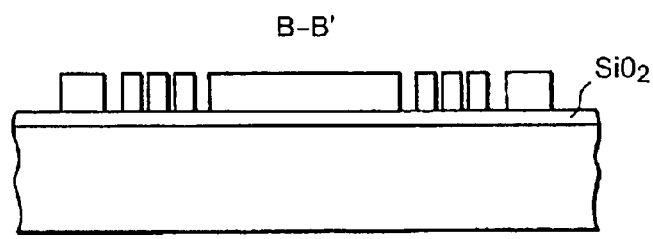
Figure 10C:
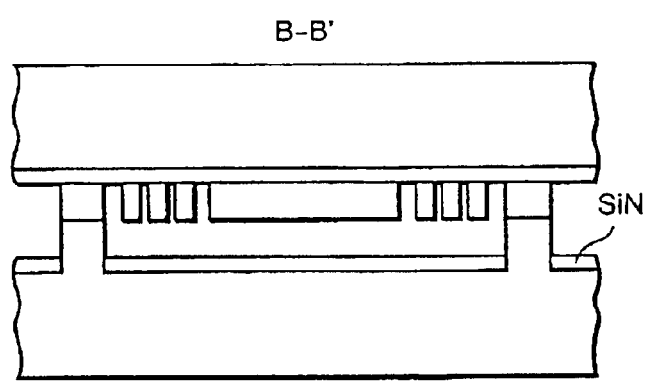
FIG. 10(c) shows a junction process of the first and second substrates in the B–B' axis to produce the optical switcher of the second embodiment.
Figure 10D:
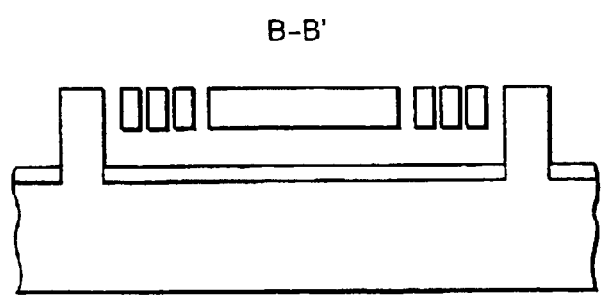
FIG. 10(d) shows a completed state in the B–B' axis of the optical switcher of the second embodiment.

FIGS. 9(a)–9(d) and FIGS. 10(a)–10(d) show producing processes of the optical switcher of the second embodiment. As shown in FIGS. 9(a) and 9(b), the trench 14 is produced in the Si-substrate 9 (first wafer) by RIE (Reactive Ion Assisted Etch) dry etching and a projecting portion is formed on the substrate 9 by the RIE dry etching. Further, as shown in FIG. 9(c), the SiN is deposited on the substrate 9 and after this, as shown in FIG. 9(d), the metal material 12 on the part of the trench wall and the wiring pattern 12' are arranged on the substrate 9. Next, to produce the mirror plate 3', spring 11 and support 13, another SOI (Silicon on Insulator) substrate (second wafer) shown in FIG. 10(a) is prepared. As shown in FIG. 10(b), the patterns corresponding to the mirror plate 3', spring 11 and support 13 are produced in the polysilicon layer of 10 m by silicon RIE etching. After this, as shown in FIG. 10(c) the first wafer and second wafer are bonded by heat treating at 1200 C. Finally, the layers of Si(500 m) and SiO$_2$(0.5 m) of FIG. 10(c) are removed by the RIE etching.

Furthermore, according to the present invention, an optical fiber array may be used as the input optical fibers $1_1$–$1_m$ and the output optical fibers $5_1$–$5_n$, and a microlens array may be used as the input collimator lenses $2_1$–$2_m$ and the output collimator lenses $4_1$–$4_n$.

According to this invention, by using the translucent mirrors as the movable switch mirrors in the m by n matrix, the optical switcher capable of sending incident light on one input port to any plurality of output ports can be provided. Thus, the optical switcher enabling the one-to-N broadcasting mode connection can be provided, and the system can be simplified and the cost can be reduced compared with the conventional signal transmission/distribution system including the photoelectric converters and the electrical switcher.

Furthermore, since a movable switch mirror located nearer the input port has a higher transmittance, the variations in the powers of the optical outputs appearing when incident light on one input port is sent to any plurality of output ports can be reduced.

What is claimed is:

1. An optical switcher, comprising:
   input ports disposed on extensions of m input optical paths (m being 2 or greater natural number);
   output ports disposed on extensions of n output optical paths (n being 2 or greater natural number);
   movable translucent switch mirrors, disposed at intersections of the m input optical paths and the n output optical paths, for switching between said input optical paths and said output optical paths to provide a one-to-L optical switcher (L being 2 or greater natural number),
   said movable translucent switch mirrors having a position reflecting a part of an input optical signal and passing another part of the input optical signal; and
   a driving mechanism for driving said movable translucent switch mirrors such that an optical signal in one of said input optical paths is delivered into a plurality of said output optical paths.

2. The optical switcher according to claim 1, wherein a movable switch mirror located nearer said input ports has a transmittance higher than a transmittance of a movable translucent switch mirror located farther from said input ports such that a plurality of delivered output optical signals in the output optical paths have approximately equal signal powers.

3. The optical switcher according to claim 1, wherein
   a movable translucent switch mirror comprises a microelectro-mechanical arrangement, and
   said microelectro-mechanical arrangement includes:
   a substrate;
   a plurality of trenches arranged in said substrate, the plurality of trenches being allocated in matrix manner;
   translucent plates disposed above each said trenches, said translucent plates being capable of rotating in said trenches; and
   driving means for rotating said translucent plates.

4. The optical switcher according to claim 3, wherein said microelectro-mechanical arrangement further includes metal material deposited on a part of wall of said trenches and said translucent plate is rotated by electrostatic attraction between said translucent plate and said metal material.

5. A one-to-N optical switcher, comprising:
   output ports disposed on extensions of n output optical paths (n being a natural number greater of at least 2);
   input ports disposed on extensions of m input optical paths (m being a natural number of at least 2), each input port connectable to plural of the output ports to enable a one-to-L broadcasting mode connection (L being a natural number of at least 2);
   movable translucent switch mirrors, disposed at intersections of the m input optical paths and the n output optical paths, the mirrors configured for switching between said input optical paths and said output optical paths,
   said movable translucent switch mirrors having a position reflecting a part of an input optical signal and also passing another, remaining part of the input optical signal; and
   a driving mechanism for driving each of said movable translucent switch mirrors such that an optical signal input to one of said input optical paths is delivered into a plurality of said output optical paths.

6. The switcher of claim 5, wherein the mirrors are linear switch mirrors moved linearly between a position reflecting only part of propagation light incident and another position reflecting none of the propagation light.

7. The switcher of claim 5, further comprising:
   a transmission link connecting to each of the mirrors and configured for selectively transmitting a displacement signal to associated ones of the mirrors to cause movement of the associated mirrors.

8. The switcher of claim 7, wherein the driving mechanism comprises an actuator corresponding to each mirror and displaceable to allow each mirror to assume, independently of other mirrors, the position in which the mirror reflects the part of incident propagation light toward an associated output port and the remaining part of the light is not intercepted, allowing the remaining part of the light to travel straight ahead toward another mirror.

9. The switcher of claim 8, further comprising an input collimator lens associated with each input port.

10. The switcher of claim 8, wherein the mirrors have different transmittance.

11. The switcher of claim 10, wherein mirrors located nearer the input ports have a first transmittance that is higher than a second transmittance of mirrors located farther from the input ports, such that each of the mirrors as a similar optical output power.

12. The switcher of claim 10, wherein mirrors located nearer the input ports have a first reflectance that is lower than a second reflectance of mirrors located farther from the input ports.

* * * * *